US005121360A

United States Patent [19]

West et al.

[11] Patent Number: 5,121,360

[45] Date of Patent: Jun. 9, 1992

[54] VIDEO RANDOM ACCESS MEMORY SERIAL PORT ACCESS

[75] Inventors: Roderick M.P. West, Chandlers Ford, England; Todd Williams, Westford, Vt.

[73] Assignee: International Business Machines Corporation, Armonk, N.Y.

[21] Appl. No.: 773,736

[22] Filed: Oct. 9, 1991

Related U.S. Application Data

[63] Continuation of Ser. No. 540,546, Jun. 19, 1990, abandoned.

[51] Int. Cl.[5] .................................... G11C 8/04

[52] U.S. Cl. .................... 365/730.03; 365/230.04; 365/230.05; 365/230.09; 365/221

[58] Field of Search .................... 365/230.23, 230.24, 365/230.25, 230.09, 221

[56] References Cited

U.S. PATENT DOCUMENTS

| | | | |
|---|---|---|---|
| 3,638,204 | 1/1972 | Kolankowsky | 365/230.05 |
| 4,833,657 | 6/1989 | Tanaka | 365/230.04 |
| 4,897,818 | 1/1990 | Redwine et al. | 365/221 |
| 4,947,373 | 8/1990 | Yamaguchi et al. | 365/221 |

*Primary Examiner*—Joseph E. Clawson, Jr.
*Attorney, Agent, or Firm*—Mark F. Chadurjian

[57] ABSTRACT

A Video Random Access Memory device wherein full and efficient use of a serial access memory portion provides a simple and efficient means of avoiding Mid-Line Reloads. Selected parts of two different rows in a random access memory portion are transferred simultaneously to the serial access memory portion via addressable transfer gates under the control of address/control logic.

15 Claims, 5 Drawing Sheets

VIDEO RANDOM ACCESS MEMORY SERIAL PORT ACCESS

This is a continuation of copending application Ser. No. 07/540,546, filed on Jun. 19, 1990, now abandoned.

BACKGROUND OF THE INVENTION

A) Technical Field

The present invention relates to memory devices capable of high speed serial data transfer to a peripheral device, such as a raster display.

B) Background Art

Video Random Access Memories (VRAMs) are a type of memory commonly used in video displays for computer systems. A VRAM is essentially a conventional dynamic random access memory (DRAM) with the addition of a second port where data may be accessed serially. A VRAM consists of a random access memory (RAM) portion and a serial access memory (SAM) portion with transfer gates which allow data to pass between the RAM and the SAM. The SAM array usually has the memory capacity of one row of the RAM array. A full row of memory data may be passed between RAM and SAM in a single data transfer access. The RAM port and the SAM port may be operated asynchronously and independently except when the data transfer between the RAM and the SAM is taking place.

This independent and asynchronous operation of the two ports finds application in the video displays of computer systems where the RAM port is used to update the contents of display memory and the serial port is used to provide data to be rastered onto the display. The RAM port may be operated at the frequency of the computer system and the SAM port at a frequency dictated by the requirements of the raster display. Since the SAM array usually has the capacity of a single row of display data, it must be continually reloaded with new rows of display data during the time of the display frame. In general, each new row of display data is obtained from a row whose index is one greater than that of the previous row. The reloading of the SAM array with new rows of display data from the RAM array is achieved by performing data transfer cycles at the RAM port. These data transfer cycles between the RAM array and the SAM array are the only interruption to the normal RAM access cycles at the RAM port. They may be separated into two distinct types. The first is data transfer when the SAM port is inactive, with no data passing to the raster display and with the serial clock stopped. This is usually associated with reloading of the SAM during blanking of the display frame. The second is data transfer when the SAM port is active, with data passing to the raster display. Since in this case the serial clock is running, the data transfer cycle at the RAM port requires accurate synchronization with the serial clock in order to maintain the required seamless flow of data to the raster display from the SAM port. This second situation is often referred to as "Real-Time Data Transfer" or "Mid-Line Reload."

In the design of a display memory subsystem, the control and timing of such mid-line reloads presents a major problem. A "Mid-Line Reload" is a critically timed real-time access, requiring synchronization between the RAM and the SAM ports, and can be very wasteful of RAM port bandwidth, a crucial aspect in many display memory subsystems. Additionally, such critically timed real time accesses may require potentially complex and high-speed circuitry to synchronize and control them. Thus, workers in the art have attempted to completely avoid mid-line reloads, so as to circumvent the critical timings and/or complex circuitry associated therewith.

The conventional method of avoiding mid-line reloads involves a number of restrictions upon how the contents of display memory are mapped onto the display screen. These restrictions include the following:

(1) use of a fixed start address for the display data on the first horizontal scan line of the display frame;

(2) use of a fixed address increment to generate the start address of each subsequent horizontal scan-line; and (3) use of a horizontal scan-line length which requires an amount of display data not greater than the capacity of the SAM arrays of the VRAMs in the display memory subsystem.

In the prior art, all of these restrictions must be satisfied in order to avoid a mid-line reload. Note that these restrictions cannot be applied to a general purpose graphics adapter or display memory subsystem.

Second generation VRAMs were enhanced with the ability to transfer half a row of random access memory into half of the SAM while the other half of the SAM is being scanned out to the display. This means of avoiding real-time data transfers is found in a 1Mbit multiport DRAM manufactured by the Toshiba Corporation, and is generally described in U.S. Pat. Nos. 4,825,411 and 4,855,959. In these so-called "Split Register" VRAMs, the SAM array divided into two halves, either of which can be loaded independently by so-called "Split Register Data Transfers" whereby one half of the SAM is loaded while the other half is active. Typically an output status pin is provided to indicate the half of the SAM being scanned out.

While split-register VRAMs alleviate mid-line reloads to some extent, they do not make full and efficient use of the SAM array capacity and can potentially result in twice as many data transfer accesses.

SUMMARY OF THE INVENTION

Accordingly, it is an object of the present invention to make full and efficient use of the SAM and to thereby provide a simple and efficient means by which, under certain circumstances, these "mid-line reloads" can be avoided.

Where system constraints prevent the total avoidance of "Mid-Line Reloads", or where, for whatever reason, it is advantageous to use "Mid-Line Reloads," it is another object of the invention to eliminate their real-time nature and thus the need for such critical timing. By removing the need for real-time VRAM data transfers, the invention eliminates the need for the potentially complex and high-speed circuitry required to synchronize and control such data transfers, and eliminates the potentially wasteful use of RAM port bandwidth in the synchronization of such data transfers.

The foregoing and other objects of the present invention are realized by VRAM comprising at least one RAM portion having a first plurality of memory cells interconnected in a plurality of rows and a plurality of columns; a SAM portion comprising a second plurality of memory cells; and means for transferring data between said RAM and said SAM, wherein data from portions of at least two rows of said RAM is substantially simultaneously transferred to said SAM.

According to another feature of the invention, the video RAM comprises a random access memory portion having a plurality of memory cells arranged within rows and columns; a serial access memory portion; a serial access means allowing external access to the serial access memory portions; and control logic for controlling the data transfer between the random access memory portion and the serial access memory portion, the control logic simultaneously coupling a first selected set of columns of a first row of the random access memory portion to the serial access memory portion, and a second selected set of columns of a second row of the random access memory portion to the serial access memory portion.

BRIEF DESCRIPTION OF THE DRAWINGS

The foregoing and other features of the present invention will become more apparent upon a review of the description of the best mode for carrying out the invention as rendered below. In the description to follow, reference shall be made to the following Drawings, in which.

DESCRIPTION OF THE BEST MODE FOR CARRYING OUT THE INVENTION

Figure 1:
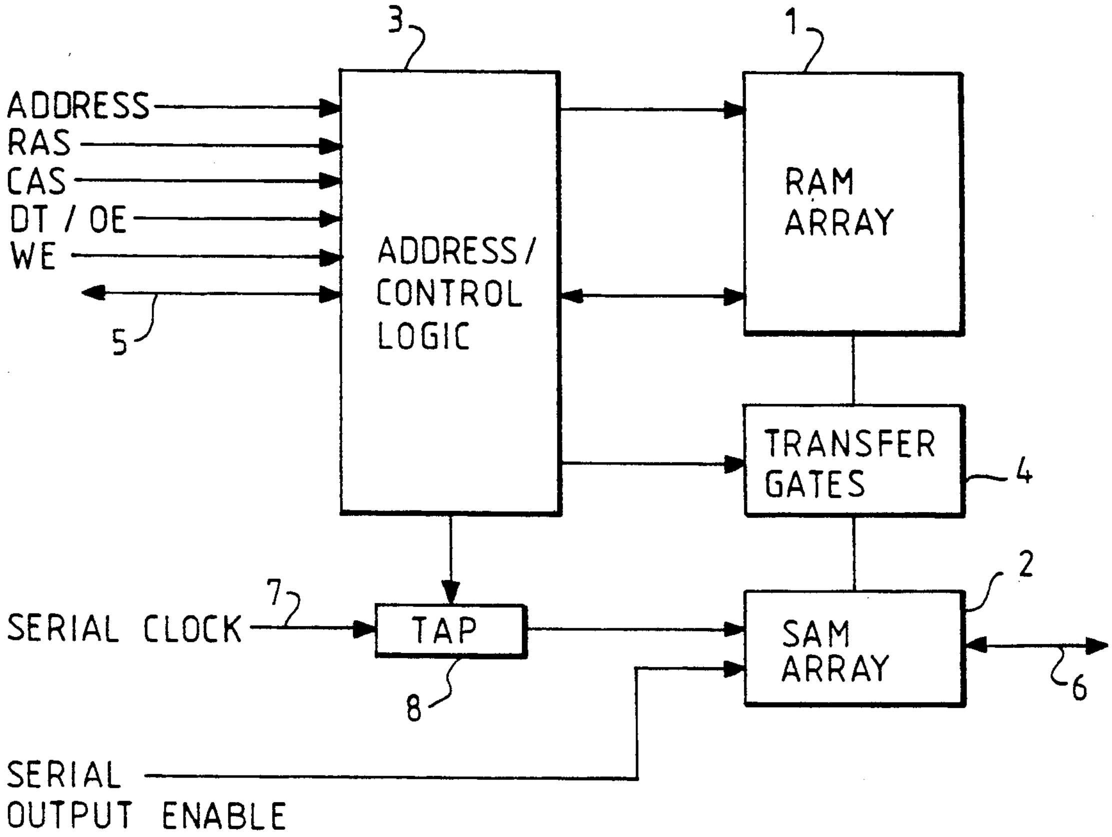
FIG. 1 PRIOR ART
FIG. 1 (Prior Art) is a block diagram of a conventional VRAM.

The structure of a conventional VRAM is shown by FIG. 1. It comprises a RAM array 1, a SAM array 2, address/control logic 3, and transfer gates 4. The RAM array is connected to the primary RAM port 5 of the VRAM and behaves in a manner identical to that of a DRAM, under the control of the address/control logic. The SAM array is connected to the secondary (SAM or Serial) port 6 of the VRAM and may be accessed serially under the control of an external asynchronous clock 7, the Serial Clock. The serial access to the SAM is controlled by the Tap Pointer (TAP) (8), which generates an address into the SAM from a counter which increments on each cycle of the Serial Clock. The Tap Pointer (TAP) is capable of being loaded with an initial address, under the control the address/control logic. The address/control logic (3) supervises the address multiplexing and the data flow on the RAM port (5) and provides all the control and global timing functions of the VRAM. The transfer gates (4) allow memory data to pass between the RAM array (1) and the SAM array (2), under the control of the address/control logic (3).

Figure 2:
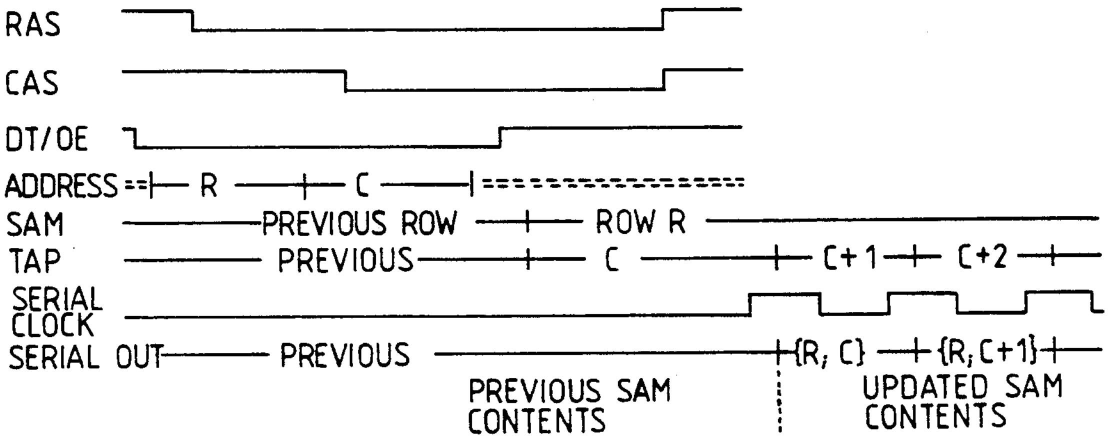
FIG. 2 PRIOR ART
FIG. 2 (Prior Art) is a timing diagram for a conventional Read Data Transfer Cycle with the Serial Clock inactive, FIG. 3 (Prior Art) is a timing diagram for a conventional Read Data Transfer Cycle with the Serial Clock active. This is the so-called "Real-Time Data Transfer"
Figure 3:
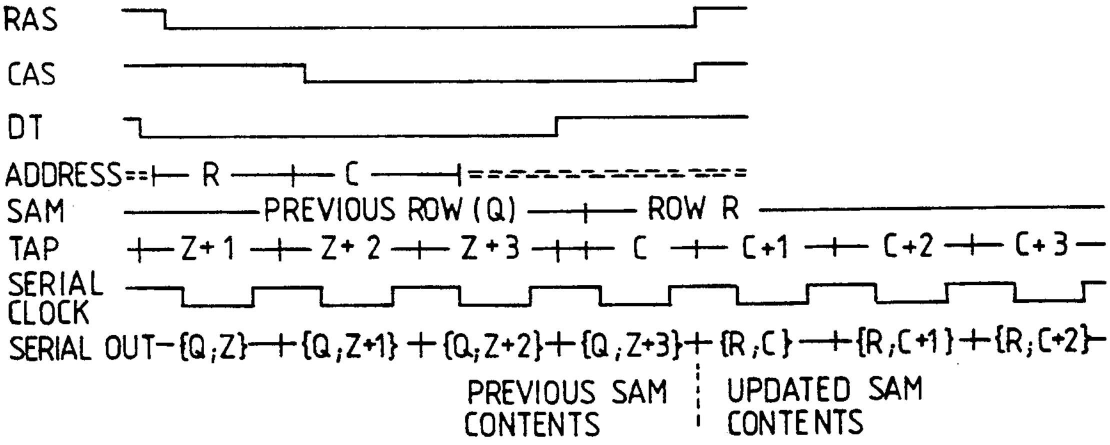
FIG. 3 PRIOR ART

The read data transfer cycles used in conventional VRAMs are shown by FIGS. 2 and 3. A Read Data Transfer cycle is indicated by DT/OE set to a low level at the falling edge of the Row Address Strobe (RAS). At the falling edge of the RAS the row address (R) is obtained from the address input and row R is activated. At the falling edge of the Column Address Strobe (CAS), the column address (C) is obtained from the address input. Subsequently, the actual RAM to SAM data transfer occurs at the rising edge of DT/OE. At the data transfer, the SAM is loaded with the contents of RAM array row R and the Tap Pointer (TAP) is loaded with the column address C. On the first rising edge of the Serial Clock after the actual data transfer, the new contents of the SAM are available at the SAM port, starting at the SAM location given by the Tap Pointer value at the time of the first Serial Clock rising edge. The first item of serial data is "R;C", the data item at row R and column C. "R;C:C+4" refers to 5 data items at row R and columns C through C+4. This notation will be used throughout the description. Each subsequent rising edge of the Serial Clock causes the Tap Pointer to increment and present the contents of the SAM serially at the SAM port: "R;C" is followed by "R;C+1", then by "R;C+2" and so on. If the read data transfer is performed with the serial clock inactive as is shown by FIG. 2, then the timing of the transfer is not critical since data is not being passed to the display. However, if the Read Data Transfer is performed with the Serial Clock running as is shown by FIG. 3, then the data transfer, signalled by the rising edge of DT/OE, must be correctly timed to occur during the correct Serial Clock cycle so as to maintain the correct sequence of data at the SAM port.

If the Tap Pointer reaches the last location in the SAM, then on the next rising edge of the Serial Clock its value wraps back to zero to address the start of the SAM and will continue to increment from zero for each subsequent Serial Clock cycle. This is generally undesirable since the sequence of data presented at the SAM port is then discontinuous, jumping from the end of the row back to the start of the same row.

In a memory system according to an embodiment of the present invention, at the falling edge of RAS, the row address (R) is obtained from the address input and two rows (R and R+1) are activated. At the falling edge of CAS, the column address (C) is obtained from the address input. At the data transfer, data is transferred between the two RAM array rows (R and R+1) and the SAM. Data is transferred between RAM array row R, column locations C to the row end, and SAM locations C to the end of the SAM. Additionally, data is transferred between RAM array row R+1, column locations 0 to C−1, and SAM locations 0 to C−1. In other words, when the Tap Pointer wraps back to zero, it will address a new row R+1.

This may be expressed as:

SAM(C:END)=R;C:END

SAM(0:C−1)=R+1;0:C−1 which may be combined in a single expression as:

SAM(0:END)=R+1;0:C−1 || R;C:END.

In these expressions the parameter END is used for the last column address of a row and the last address of the SAM. The diadic operator " || " implies concatenation. This form of data transfer we shall designate Column Wrapped Data Transfer (CWDT). The column address (C) forms the boundary of the CWDT.

Figure 4:
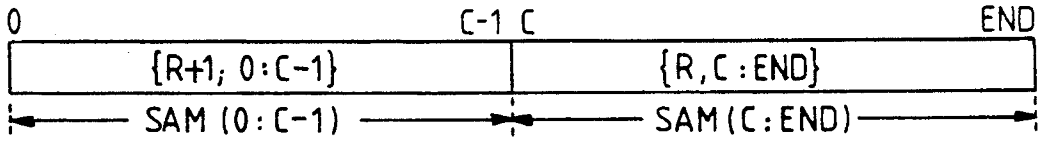
FIG. 4 is a map of the serial access memory after a column wrapped read data transfer of the invention.

Thus, after a CWDT Read Data Transfer, the SAM contains a full row of continuous data from address R;C to R+1;C−1, starting at SAM(C). The data is continuous in RAM address space starting at the CWDT boundary with R;C at SAM(C) and wrapping around the end of the SAM through to R+1;C−1 at SAM(C−1). This is shown diagrammatically as the map of the SAM and its contents shown by FIG. 4.

The CWDT function may be used as an alternative to, or in addition to the conventional data transfer accesses available in current VRAMs. For a VRAM providing both CWDT and conventional data transfers, a function pin or by another suitable means can be used to distinguish between them. In the embodiment described here it is assumed that the CWDT function is used in place of conventional VRAM data transfers.

It is advantageous that the RAM array be segmented into at least two segments such that at least one row address bit (including the least significant bit) is used to select a segment and the remainder of the row address bits are used to select a row within each segment. Such memory segmentation is employed in large memories in order to reduce the loading on individual rows and columns. This decreases signal generation and propagation delays while reducing both variation in data rates and power consumption. For a memory in accordance with the invention, the segmentation of the memory also enables the simplification of the simultaneous activation of a plurality of rows by placing logically sequential rows in physically separate segments.

Figure 5:
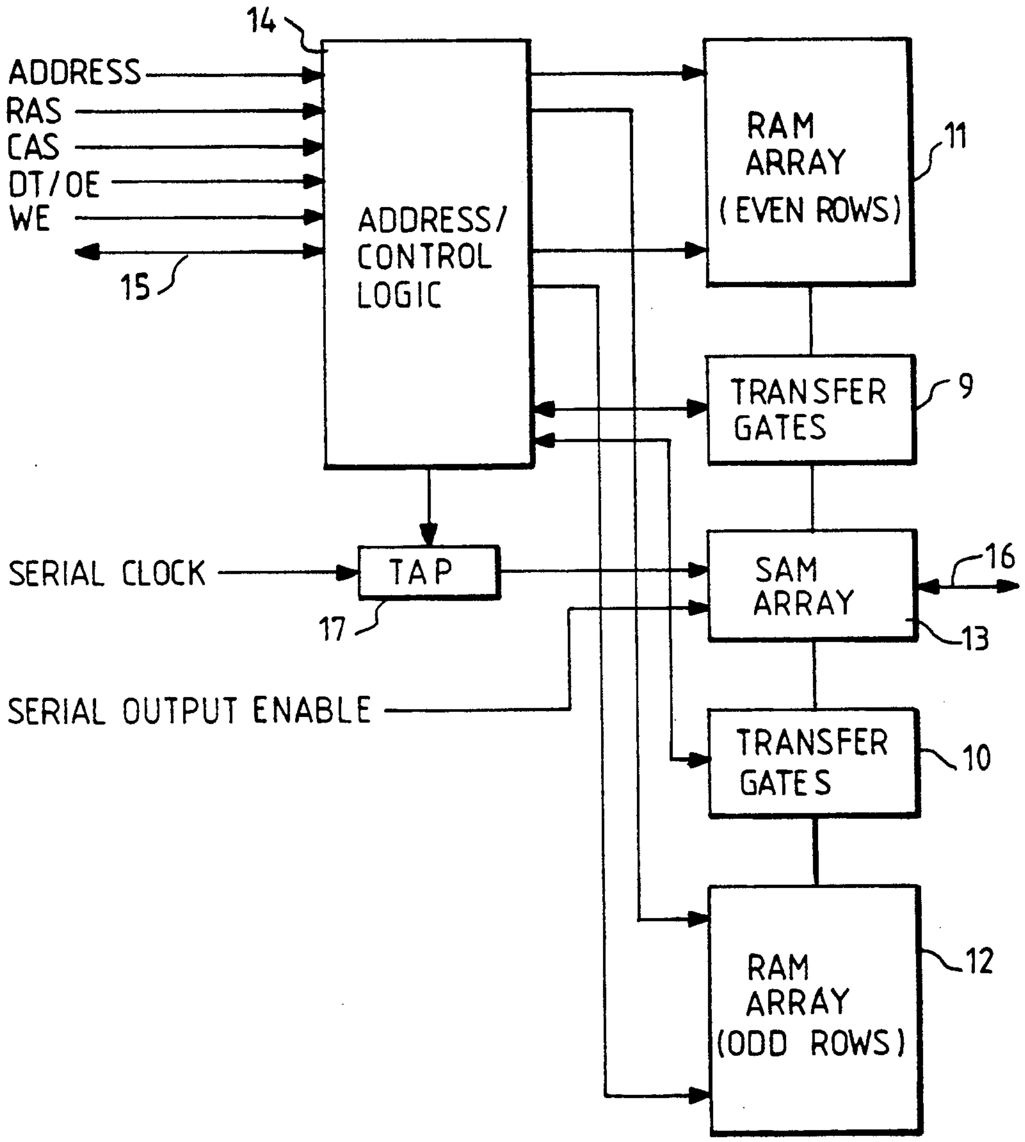
FIG. 5 is a block diagram of a video random access memory of the invention in which the RAM portion is segmented into two segments.

FIG. 5 is a block diagram of a VRAM with the RAM array segmented into two physically separate segments. One segment contains all even rows and the other contains all odd rows. Each segment has a separate set of transfer gates (9,10) to allow memory data to pass between the RAM array segments (11,12) and the SAM array (13), under the control of the address/control logic (14). The RAM port (15) operation of the VRAM is unchanged, and its SAM port operation (16) is only changed by the use of the CWDT function.

With reference to FIG. 5, the CWDT data transfer is achieved by the address/control logic (14) activating two rows (R and R+1 in separate segments) and selecting which transfer gates to open, allowing selective data transfer between the two rows and the SAM. For a CWDT data transfer with row address R and column address C, the address/control logic selects transfer gates (C:END) for the segment containing row R and transfer gates (0:C−1) for the segment containing row R+1. In this way the CWDT boundary is quantised at single column granularity and this requires that the column address (C) be fully decoded for the selection of transfer gates. In many cases however, it would be sufficient to quantise the CWDT boundary at higher granularity (e.g. at 2,4,8,16,32. . . column boundaries). This reduces the demand on the decoding of the column address in the formation of the CWDT boundary and transfer gate selection. The invention has beneficial application even when the CWDT boundary granularity is extremely coarse. If only the most significant 3 bits of C are decoded the transfer gates are divided into 8 separate blocks along the row length. In the most extreme form, only the most significant bit of C is used to select transfer gates divided into 2 separate blocks.

Although CWDT will be discussed in relation to Read Data Transfers (RAM to SAM), as used in a display memory subsystem, it also finds application in relation to Write Data Transfers (SAM to RAM) found in some current VRAMs. The application of CWDT to Write Data Transfers will not be discussed but is within the scope of the present invention, as will be apparent to those skilled in the art.

The present invention provides for two forms of CWDT. The two forms differ only in whether or not the Tap Pointer (17) is updated. The first form of CWDT, designated CWDT#1, is similar to a conventional Read Data Transfer in that, at the time of data transfer, the Tap Pointer is loaded with the column address (C) obtained at the falling edge of CAS. The second form of CWDT, designated CWDT#2, differs from a conventional Read Data Transfer in that, at the time of data transfer, the Tap Pointer remains unchanged. Both forms of CWDT may be used with the Serial Clock either inactive or running. It is considered that CWDT#1 is more likely to be used with the Serial Clock inactive and CWDT#2 is more likely to be used with the Serial Clock running. CWDT#1 updates both the contents of the SAM and the Tap Pointer, therefore, if it is used with the Serial Clock running, the data transfer must be accurately timed with respect to the Serial Clock cycles. CWDT#2 updates only the contents of the SAM. When CWDT#2 is used with the Serial Clock running, the data transfer need not be accurately timed with respect to the Serial Clock cycles.

Figure 6:
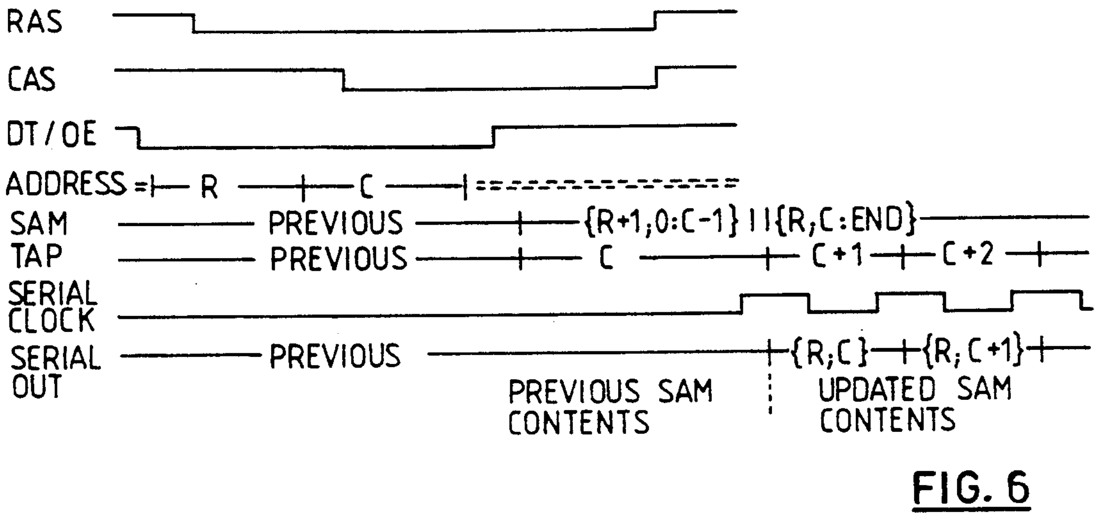
FIG. 6 is a timing diagram for a first form of column wrapped read data transfer with the serial clock inactive.
Figure 7:
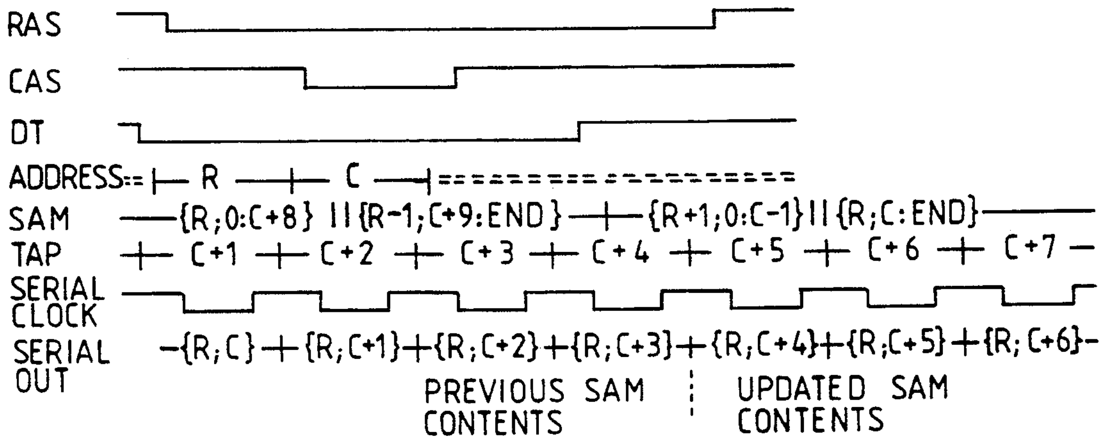
FIG. 7 is a timing diagram for a second form of column wrapped read data transfer with the serial clock active.

FIGS. 6 and 7 are timing diagrams illustrating the two forms of CWDT. FIG. 6 illustrates CWDT#1, by a Read Data Transfer with the Serial Clock inactive. FIG. 7 illustrates CWDT#2, by a Read Data Transfer with the Serial Clock active. In this embodiment of the invention the two forms of CWDT are distinguished by the level of CAS at the rising edge of DT/OE. If CAS is at a low active level at the rising edge of DT/OE then the Tap Pointer is updated, and is CWDT#1 shown by FIG. 6. If CAS is at a high inactive level at the rising edge of DT/OE then the Tap Pointer is not updated, and is CWDT#2 shown by FIG. 7.

As in conventional VRAMs, a Read Data Transfer cycle is indicated by DT/OE set to a low level at the falling edge of RAS. At the falling edge of RAS, the row address (R) is obtained from the address input and two rows (R and R+1 in separate segments) are activated. At the falling edge of CAS, the column address (C) is obtained from the address input. The column address (C) forms the boundary of the CWDT. Subsequently, the actual RAM to SAM data transfer occurs at the rising edge of DT/OE. The level of the CAS at the rising edge of DT/OE determines whether the Tap Pointer (TAP) is to be loaded with the column address C, hence whether the CWDT is a CWDT#1 or a CWDT#2. This is one particular means of control of the CWDT function. Other means of control can be devised, with the relative timings, polarities and operative functions of control inputs varied. The actual operation of CWDT accesses will depend on a number of factors, including whether the CWDT feature is offered as an alternative to or in addition to conventional data transfer accesses.

At the data transfer, the SAM is loaded with R+1;0:C−1 || R;C:END, the contents of RAM array rows R and R+1 divided at the CWDT boundary (C), and the Tap Pointer (TAP) is loaded with the column address C if the CWDT access is a CWDT#1. On the first rising edge of the Serial Clock after the actual data transfer, the new contents of the SAM are available at the SAM port, starting at the SAM location R;C given by the Tap Pointer value at the time of the first Serial Clock rising edge. Each subsequent rising edge of the Serial Clock, causes the Tap Pointer to increment and present the contents of the SAM serially at the SAM port: R;C is followed by R;C+1, R;C+2 and so on. When the Tap Pointer reaches the last location in the SAM, then on the next rising edge of the Serial Clock its value wraps back to zero to address the start of the SAM and will continue to increment from zero for each subsequent Serial Clock cycle. The serial data sequence around the time of the Tap Pointer wrapping back is R;END−1, R;END, R+1;0, R+1;1, R+1;2 and so on. Thus the serial data sequence moves across the row boundary in a seamless and continuous manner in RAM address space.

For a CWDT#2 Read Data Transfer (as in FIG. 7), where the Tap Pointer has not been updated and the Serial Clock is active, in order to keep the serial data sequence seamless and avoid any critical timing of the data transfer, the data transferred to the SAM must be the same as and overlap the previous SAM data in the region of the Tap Pointer at the time of the actual data transfer. To illustrate this, in FIG. 7, the data in the SAM prior to the data transfer is R;0:C+8 || R−1;C+9:END. This data was loaded into the SAM by a previous CWDT, with a row address of R−1 and a column address of C+9. At the data transfer, the SAM is loaded with R+1;0:C−1 || R;C:END. The data in SAM locations SAM(C:C+8) is unchanged by the data transfer and remains as R;C:C+8. This region of unchanged data is termed the "Overlap Region".

Figure 8:
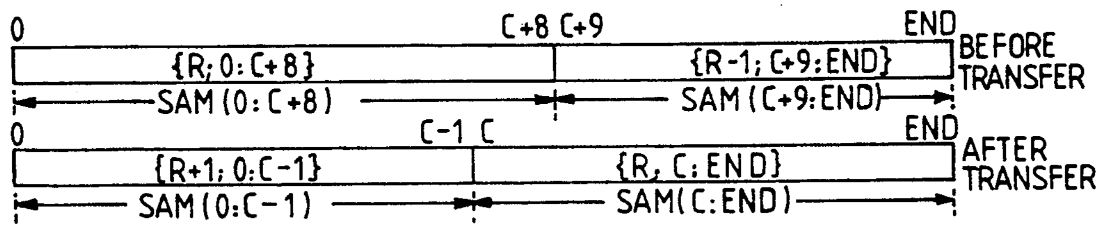
FIG. 8 is a map of the serial access memory before and after a type 2 column wrapped data transfer with the serial clock active.

This is be shown diagrammatically by the maps of the SAM and its contents shown by FIG. 8 and by the following table:

| SAM locations | Data contents before transfer | Data contents after transfer |
|---|---|---|
| (0:C−1) | R;0:C−1 | R+1;0:C−1 |
| (C:C+8) | R;C:C+8 | R;C:C+8 |
| (C+9:END) | R−1;C+9:END | R;C+9:END. |

In the timing diagram (FIG. 7), the actual data transfer is shown to occur when the Tap Pointer has a value of C+4. On the first rising edge of the Serial Clock after the actual data transfer, the new contents of the SAM are available at the SAM port, starting with R;C+4. The CWDT#2 data transfer does not alter or affect the incrementing sequence of the Tap Pointer. Here, the data transfer need not be critically timed within the Serial Clock stream, provided that at the moment of data transfer the Tap Pointer is anywhere within the "Overlap Region" SAM (C:C+8); that is, critical timings are not a concern because the data within the Overlap Region has not changed as a function of CWDT operations. The choice of the size of the Overlap Region must be based on system constraints to ensure seamless serial data. Thus, in the example of FIG. 7, the serial data sequence can proceed in a seamless manner and continuously from R−1;C+9 through to R+1;C−1, nearly two full rows linked by a single CWDT#2 access; a sequence which can be extended by further CWDT#2 accesses. This is achieved without any real-time data transfers.

Note that a Mid-Line Reload using a conventional real-time read data transfer has a "Transfer Window" confined to a single Serial Clock cycle; the CWDT#2 read data transfer has a Transfer Window as wide as the Overlap Region.

As an extension to the CWDT data transfer accesses described above, it would be possible to apply different values to the CWDT boundary and the update of the Tap Pointer. At the falling edge of CAS, the CWDT boundary is obtained from the address input. Provided that CAS is at an active low level (i.e. CWDT#1), the value used to update the Tap Pointer is obtained from the address input at the rising edge of DT/OE. In this manner, the CWDT boundary and the Tap Pointer can be set at different values.

Figure 9:
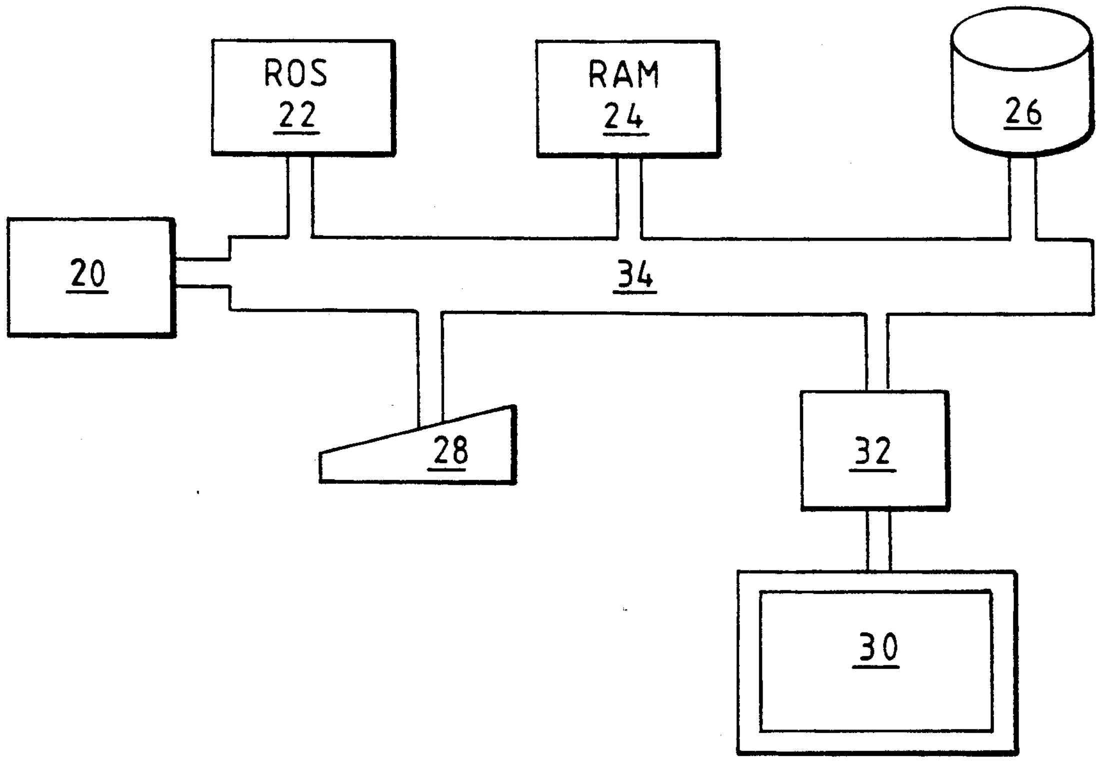
FIG. 9 is a block diagram of a display system employing a memory according to the invention.

FIG. 9 is a block diagram of a display system employing a memory according to the invention. It shows a workstation consisting of a Central Processing Unit (CPU) 20, a Read Only Store (ROS) 22, a Random Access Memory 24, a disk drive for data storage 26, a user interface 28 which may be a keyboard and/or a mouse, a display device 30 connected via a display adapter 32. These units are connected together by a system bus 34. The display adapter 32 contains a display memory which employs a VRAM, according to the invention, wherein the RAM portion is updated via the RAM port, and the serial access port is used to provide data to be rastered onto the display, 30. It should be noted that this is only one possible embodiment of a display system according to the invention. Many other types are possible, including mainframe data processing systems with a number of users wherein there is a display device and display adapter for each user.

The invention simply and efficiently achieves full utilization of the SAM portion in a VRAM. Every CWDT read data transfer loads the SAM with data that is continuous in RAM address space starting at the CWDT boundary and of a length equal to the full capacity of the SAM. By starting at the CWDT boundary, the serial data sequence can move in a seamless manner across a row address boundary, providing sequential data up to the full capacity of the SAM before a further data transfer is required. A conventional read data transfer does not permit the serial data sequence to move across row address boundaries without a real-time data transfer. A conventional read data transfer can only utilize the full capacity of the SAM, in a manner appropriate to a display memory subsystem, when the column address is 0.

The invention eliminates the need for "Mid-Line Reloads" in a display memory subsystem, by utilizing the full capacity of the SAM. Additionally, the invention reduces the number of VRAM data transfers required for each display frame. Where system constraints prevent the total avoidance of "Mid-Line Reloads", or where it is advantageous to use "Mid-Line Reloads", the CWDT#2 data transfer provides a means of eliminating the real-time nature of the "Mid-Line Reload". By removing the need for real-time VRAM data transfers, CWDT eliminates the need for the potentially complex and high speed circuitry required to synchronize and control such data transfers, and eliminates the potentially wasteful use of RAM port bandwidth in the synchronization of such data transfers.

While the invention has been described with reference to a particular embodiment, various modifications can be made to the foregoing structures and teachings without departing from the spirit and scope of the invention. It is an advantage of the invention that CWDT may be used as an alternative to, or in addition to the conventional data transfer accesses available in current VRAMs. Although CWDT has been discussed in relation to Read Data Transfers (RAM to SAM), as used in a display memory subsystem, it also finds application in relation to the Write Data Transfers (SAM to RAM) found in some current VRAMs.

We claim:

1. A memory device comprising:

a random access memory comprising a plurality of memory cells arranged in rows and columns and accessed by row address signals R and column address signals C;

a serial access memory;

a serial access means allowing external access to the serial access memory; and control logic for controlling the data transfer between the random access memory and the serial access memory, the control logic coupling a first selected set of columns of a first row of the random access memory, and a second selected set of columns of a second row of the random access memory, to the serial access memory, wherein both the number of said columns and the respective ones of said columns in said first and second selected sets are determined by said column address signal C.

2. The memory device of claim 1, wherein the random access memory is divided into at least two segments, such that logically adjacent rows are located in different segments.

3. The memory device of claim 2, wherein said first row is located in a first segment, and said second row is logically adjacent the first row and is located in a second segment.

4. The memory device of claim 3, wherein each of said first and second rows are coupled to N respective columns 0 to N.

5. The memory device of claim 4, wherein said first selected set of columns comprise columns 0 to $C-1$, wherein $0<C-1<N$.

6. The memory device of claim 5, wherein said second selected set of columns comprise columns C to N.

7. The memory device of claim 4, wherein said set of columns comprise columns 0 to $C-1$, wherein $0<C--1<N$.

8. The memory device of claim 7, wherein said first selected set of columns comprise columns C to N.

9. The memory device of claim 6, wherein in a subsequent data transfer, said second selected set of columns comprise columns C-Y to N, wherein $Y>1$.

10. The memory device of claim 9, wherein said first selected set of columns comprise columns 0 to $C-X$, wherein $X=Y-1$.

11. The memory device of claim 10, wherein columns between and including columns C-Y to $C-1$ are accessed immediately after said second data transfer.

12. The memory device of claim 1, further comprising a pointer that is loaded with an initial address indicating a storage location within the serial access memory to be accessed by the serial access means.

13. The memory device of claim 12, wherein the address stored by said pointer is updated, simultaneously with data transfer between the random access memory and the serial access memory, with the value of said selected column.

14. A memory device of claim 12, wherein the pointer is updated, simultaneously with data transfer between the random access memory and the serial access memory, with a value different from that of the selected column.

15. A memory device, comprising a random access memory comprising a plurality of RAM memory cells arranged in a plurality of rows and columns and accessed by receipt of row and column address signals:

a serial access memory comprising N SAM memory cells; and control logic for coupling a first number X of said RAM memory cells from a first selected row and a second number Y of said RAM memory cells from a second selected row to respective ones of said SAM memory cells, wherein said first and second number X and Y are determined by said column address signals.

* * * * *